US007278056B2

(12) United States Patent
Hekmatpour

(10) Patent No.: US 7,278,056 B2
(45) Date of Patent: Oct. 2, 2007

(54) METHODS, SYSTEMS, AND MEDIA FOR MANAGEMENT OF FUNCTIONAL VERIFICATION

(75) Inventor: Amir Hekmatpour, Cary, NC (US)

(73) Assignee: International Business Machines Corporation, Armonk, NY (US)

(*) Notice: Subject to any disclaimer, the term of this patent is extended or adjusted under 35 U.S.C. 154(b) by 514 days.

(21) Appl. No.: 10/864,628

(22) Filed: Jun. 9, 2004

(65) Prior Publication Data

US 2005/0278576 A1    Dec. 15, 2005

(51) Int. Cl.
    *G06F 11/00*    (2006.01)
(52) U.S. Cl. ............................. 714/37; 714/33; 716/5
(58) Field of Classification Search ................ 714/37, 714/33, 703
    See application file for complete search history.

(56) References Cited

U.S. PATENT DOCUMENTS

| | | | |
|---|---|---|---|
| 5,022,028 A | | 6/1991 | Edmonds et al. |
| 5,271,000 A | | 12/1993 | Engbersen et al. |
| 5,544,310 A | | 8/1996 | Forman et al. |
| 5,673,387 A | | 9/1997 | Chen et al. |
| 5,694,540 A | | 12/1997 | Humelsine et al. |
| 5,724,504 A | * | 3/1998 | Aharon et al. ................ 714/33 |
| 5,922,079 A | * | 7/1999 | Booth et al. .................. 714/26 |
| 6,212,667 B1 | * | 4/2001 | Geer et al. ..................... 716/6 |
| 6,263,456 B1 | | 7/2001 | Boxall et al. |
| 6,301,701 B1 | | 10/2001 | Walker et al. |
| 6,304,982 B1 | | 10/2001 | Mongan et al. |
| 6,356,858 B1 | * | 3/2002 | Malka et al. ................ 702/186 |
| 6,381,604 B1 | | 4/2002 | Caughran et al. |
| 6,397,359 B1 | | 5/2002 | Chandra et al. |
| 6,415,396 B1 | * | 7/2002 | Singh et al. .................. 714/38 |
| 6,427,000 B1 | | 7/2002 | Mumford et al. |
| 6,647,513 B1 | * | 11/2003 | Hekmatpour ................ 714/37 |
| 6,687,662 B1 | * | 2/2004 | McNamara et al. .......... 703/14 |
| 7,139,676 B2 | * | 11/2006 | Barford ...................... 702/183 |
| 2002/0002698 A1 | * | 1/2002 | Hekmatpour ................ 716/4 |
| 2004/0154001 A1 | * | 8/2004 | Haghighat et al. .......... 717/130 |
| 2006/0265609 A1 | * | 11/2006 | Fung .......................... 713/300 |

FOREIGN PATENT DOCUMENTS

JP    07-104834 A    4/1995

OTHER PUBLICATIONS

IBM, "Research Disclosure", v41, n412, #41265 (Aug. 1998).
Black, M.D.; Nguyen, T.L.: & Freeman, A.T.;"IBM Technical Disclosure Bulletin" v36, n8,pp. 127-130 (Aug. 1993).

* cited by examiner

*Primary Examiner*—Marc Duncan
(74) *Attorney, Agent, or Firm*—Joscelyn G. Cockburn; Schubert Osterrieder Nickelson PLLC

(57) ABSTRACT

Methods, systems and media for management of functional verification of a system are disclosed. One embodiment may be directed to methods, systems and media for management of functional verification of a computer system, such as a processor or IC chip. Embodiments may include a verification manager for user input and a functional verification database for centralized storage of functional verification information. Embodiment may also include a coverage analysis environment that receives test information from a simulation and test generation environment, converts it if necessary, and selectively stores information in the functional verification database. In a further embodiment, a harvest module determines whether a test should be saved for future regression testing, and tests that add to functional coverage are added to a regression suite.

19 Claims, 7 Drawing Sheets

FIG. 7

| COVERAGE EVENT | # OF MONITORS | ACTUAL HITS | GOAL HITS | % COVERAGE |
|---|---|---|---|---|
| SUBMITNO INSTRUCTIONS | 15 | 1200 | 1600 | 75 |
| BLOCK PREDED.DATA | 32 | 1800 | 10,000 | 18 |
| LMQTABLE | 32 | 2700 | 10,000 | 27 |
| DISSOFAPIPE | 10 | 1000 | 1,000 | 100 |
| DIVHOLD | 10 | 900 | 1,000 | 90 |
| MF INC | 20 | 2 | 100 | 2 |
| TOTAL | 120 | 7602 | 23,700 | 31 |

702

| COVERAGE MONITOR | ACTUAL HITS | GOAL HITS | % COVERAGE |
|---|---|---|---|
| SUBMITNO INSTRUCTIONS01 | 100 | 100 | 100 |
| SUBMITNO INSTRUCTIONS02 | 50 | 100 | 50 |
| SUBMITNO INSTRUCTIONS03 | 70 | 100 | 70 |
| SUBMITNO INSTRUCTIONS04 | 100 | 100 | 100 |
| SUBMITNO INSTRUCTIONS05 | 20 | 100 | 20 |
| ... | ... | ... | ... |
| SUBMITNO INSTRUCTIONS16 | 65 | 100 | 65 |
| TOTAL | 1200 | 1600 | 75 |

704

METHODS, SYSTEMS, AND MEDIA FOR MANAGEMENT OF FUNCTIONAL VERIFICATION

BACKGROUND OF THE INVENTION

1. Field of the Invention

The present invention generally relates to the field of functional verification of complex systems. More particularly, the present invention relates to methods, systems, and media for autonomous management and control of distributed verification of designs such as integrated circuit (IC) designs.

2. Description of the Related Art

When designing increasingly complex processors or IC chips such as Application-Specific ICs (ASICs) and system-on-chips (SoC's), functional verification has proven to be a major bottleneck in achieving time-to-market goals. Many companies now realize that functional verification of complex chips has become an inefficient, unwieldy, and incomplete process. Design teams report that functional verification of medium- to large-complexity processors, ASICs or SOC's may consume over 70% of the project's manpower, schedule and budget. In spite of the time and resources consumed by functional verification, it is still often incomplete, allowing design bugs to go undetected.

The design process for a Very Large Scale Integrated (VLSI) chip starts with the creation of a functional specification for the design. Once the functional specification has been completed, the verification team typically creates a test plan that specifies the design features and functions to be tested at both the block and system levels. The verification team then creates testbenches (also known as tests) such as deterministic tests and tests automatically generated to verify design functionality until all test plan requirements have been met. The process of verifying the functional specification is called functional verification, which encompasses the development and implementation of this test plan.

Functional verification ensures functional conformance of an integrated circuit design to its architectural and microarchitectural specifications and determines whether a design is logically correct. The verification process involves developing and simulating tests that are used to determine whether design components (e.g., processor units, resources, functions, etc.) behave according to their functional specification, from both an architectural and microarchitectural perspective. Functional verification is typically completed before fabrication of the processor, as finding and fixing errors, or bugs, after fabrication proves to be time-consuming and expensive.

Today, the scope of functional verification has gone beyond simulation. While simulation is still the major component of functional verification, other methods have enhanced the ability to ensure the correctness of the design. The tools created to augment the simulation utilizing these methods, however, are generally of limited utility from one project to another. These tools must therefore be customized for use in the functional verification of a particular processor or for a specific project. Personnel skilled in customizing these generic tools have become a valuable commodity, as verification teams that can write testcases, behaviorals, and checkers that efficiently isolate the bugs in a design have a major, positive influence on time-to-market and costs.

To manage the verification of today's complex designs and to be responsive to frequent design specification changes and upgrades, an efficient, iterative process that may be used throughout the duration of the design is desired.

Hardware and software teams have consistently found that iteration is an inevitable part of the design process. There is significant value in planning for iteration and developing a methodology that minimizes the overall design time. Verification is a major component of the design process and efficient management of its tasks and resources are important in reducing the number of design iterations and optimizing the length of each iteration. Improved functional verification can cut costs, improve design quality and accelerate time-to-market. Moreover, improved functional verification enables companies to sharply increase the productivity of their precious resource, verification personnel.

Different methods have been developed to improve the quality and efficiency of the functional verification. These methods include random test generation, coverage-driven verification, coverage-driven test generation, formal verification methods and assertion-based verification.

Random test verification is the attempt to randomly generate tests to validate some feature of the design. Random test verification, while it may appear to reduce the effort necessary for test generation, instead typically generates low quality and redundant tests that may not cover all features of the design. Generation, simulation, and debugging of low quality and redundant tests wastes scarce verification resources.

Coverage Driven Verification (CDV) is the integrated verification methodology and environment where verification tasks and activities are defined and scheduled based on the actual verification achieved thus far (i.e. actual functional coverage). Functional coverage is the study and analysis of the quality and completeness of functional verification. It includes statistical, stochastic and heuristic analysis of functional verification progress and completeness. CDV is independent of any specific tool or method but rather utilizes any and all available tools and method to achieve a pre-defined set of verification goals. CDV is heavily dependent on a comprehensive and accurate coverage analysis.

Coverage Driven Generation (CDG) refers to test generation (Random, Psuedo-Random, Deterministic, etc.) with an awareness of functional coverage achieved by tests generated thus far. CDG may also refer to the act of test generation itself, where rather than specifying test specifications, the user specifies functional coverage attributes desired. The test generator then tries to generate a set of tests that target the desired coverage attributes. Coverage analysis techniques are utilized for estimating or measuring the architectural and microarchitectural attributes of a generated test.

Formal methods can be applied to the design for verification of design features, as well as identifying design connectivity and signal propagation characteristics. In most such cases, a set of formal rules or design behavior specifications are defined and applied against a compiled model of the design to identify any deviation from the formal specification (rules). Some tools can generate a set of checkers and monitors from the formal rules which can then be used along with the simulation-based verification.

Assertion-based verification technique often relies on arbitrary or non-test plan based factors. Design and verification engineers define checkers and monitors that define design features that need to be verified or critical sequences of operations to be monitored. There is no way to know that all necessary checkers and monitors have been defined. Assertion-based verification is flawed by the inability to have any certainty that functional verification is complete, but it does pinpoint the source of a malfunction when one is detected.

Functional verification systems must measure functional coverage, identify holes in functional verification, and determine with confidence when functional verification is complete before committing to fabrication. Unfortunately, current functional verification approaches and their limitations cause many design teams to rely on code coverage, rate of new bugs found, or the project schedule to determine when functional verification is completed.

Therefore, there is a need for methods, systems, and media to reduce the amount of resources required for functional verification, to improve its quality, and to provide more effective means for managing distributed and heterogeneous verification environments. Continuous and flexible monitoring of verification processes to determine when verification goals have been achieved is also desired.

SUMMARY OF THE INVENTION

Embodiments of the invention generally provide systems, methods and media for managing functional verification of integrated circuit designs. One embodiment provides a platform for controlling and/or managing the functional verification of a system. The system generally includes a verification manager responsive to user input and coupled to a functional verification database. The functional verification database may serve as a central design and verification repository.

The system generally also includes a coverage analysis environment coupled to the functional verification database. The coverage analysis environment is adapted to receive test information from a simulation and test generation environment and selectively stores information based on the test information in the functional verification database. In an alternative embodiment, the coverage analysis environment converts test information to a standard format, allowing for a "plug and play" architecture. In another alternative embodiment, the coverage analysis environment provides management and control of distributed computers, such as those on a server farm, performing test generation, simulation, verification data harvesting, analysis tasks, etc.

A further embodiment also includes a harvest module coupled to the functional verification database that determines whether a test should be saved for regression testing based on whether the test contributes to the progress of verification. This embodiment also includes a regression suite for storing regression tests selected by the harvest module.

A further embodiment provides a method for performing functional verification of a system. The method may include requesting a test and receiving and saving an indication of the results of the test. The method may further include determining, based on the indication of the results of the test, whether the test adds to functional coverage and if so, archiving the test in a regression suite.

A further embodiment provides a method for monitoring tests received from a simulation and test generation environment and determining for each whether it adds to the functional coverage. The method of this embodiment further provides transmitting the test to a regression suite.

A further embodiment provides an integrated interface for monitoring, controlling, and managing verification tasks, tools, and processors, as well as defining verification strategies and associated tasks, resources and priorities.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 7 depicts one embodiment of tables generated by the report generator of the verification manager of FIG. 2.

DETAILED DESCRIPTION OF THE PREFERRED EMBODIMENTS

The following is a detailed description of embodiments of the invention depicted in the accompanying drawings. The embodiments are examples and are in such detail as to clearly communicate the invention. However, the amount of detail offered is not intended to limit the anticipated variations of embodiments, but on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Generally speaking, methods, systems and media for management of processor functional verification are contemplated. Embodiments may receive test and it's simulation results and determine whether the test or simulation improves the functional verification, optionally archiving the test in a regression suite, and scheduling the next task according to the active strategy.

A further embodiment provides a method for performing functional verification of a system. The method may include requesting a test and receiving and saving an indication of the results of the test. The method may further include determining, based on the indication of the results of the test, whether the test adds to functional coverage and if so, archiving the test in a regression suite. The method may further include compiling and scheduling the appropriate follow-up tasks, such as requesting more tests for further analysis.

A further embodiment provides a method for monitoring tests received from a simulation and test generation environment and determining for each whether it adds to the functional coverage. The method of this embodiment further provides transmitting the test to a regression suite.

Figure 1:
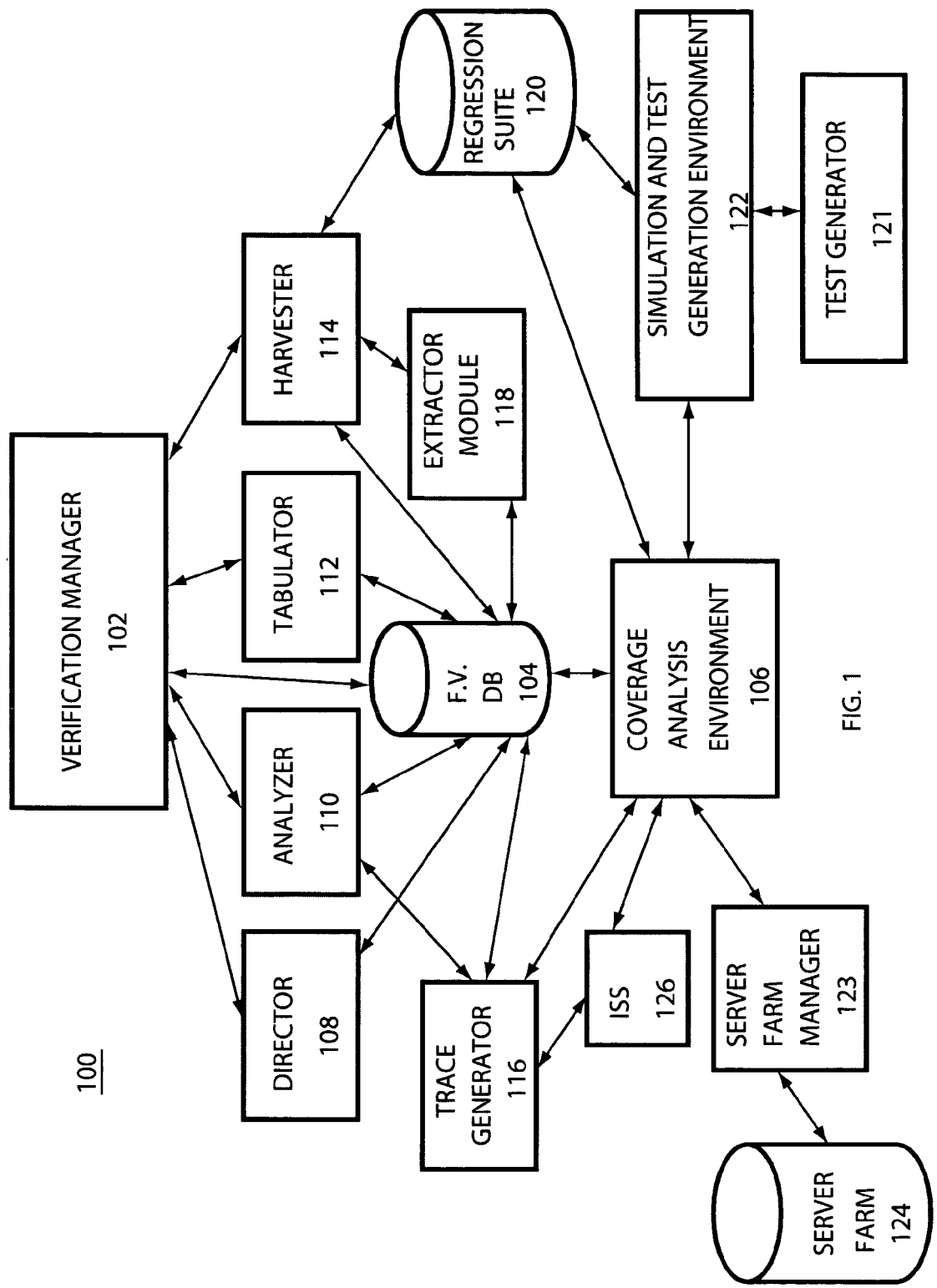
FIG. 1 depicts a functional verification management system according to one embodiment.

The systems, methods and media of the present invention provide a functional verification management system that allows designers and verification engineers to create powerful testbenches that efficiently uncover bugs, simplify debugging, and accurately measure progress against the test plan. The present invention supports a complete coverage analysis, including both architectural coverage analysis of the design and a comprehensive microarchitectural coverage analysis, with specific tools and techniques for their support and management across the entire verification process. Any features and parameters of the verification process may be monitored and optionally be modified by users. The systems, methods, and media of the present invention also provide a more efficient use of processing and storage resources by optionally providing for a centralized functional verification database as well as by management of the regression suite and verification resources such as computers, Electronics Design Automation (EDA) tool licenses, and engineering resources Turning now to the drawings, FIG. 1 depicts a functional verification management system in one embodiment. In the depicted embodiment, functional verification management system 100 includes a verification manager 102, a functional verification database 104, a coverage analysis environment 106, a regression suite 120, and multiple management modules, including a director module 108, an analyzer module 110, a tabulator module 112, a harvester module 114, a trace generator module 116, and an extractor module 118. The coverage analysis environment 106 and the regression suite 120 may be in communication with a simulation and test generation environment 122, which may be separate from system 100. The simulation and test generation environment 122 may in turn be in communication with one or more test generators 121. The coverage analysis environment 106 may also be in communication with a coverage server farm 124, such as via a server farm manager 123. Trace generator module 116 may optionally be in communication with the coverage analysis environment 106 either directly or via an optional Instruction Set Simulator (ISS) 126. All components of system 100 may be programmed, accessed, controlled, and/or managed by or utilizing the verification manager 102.

Each software program described herein, such as those described in relation to FIG. 1, may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present invention, represent embodiments of the present invention.

In general, the routines executed to implement the embodiments of the invention, may be part of an operating system or a specific application, component, program, module, object, or sequence of instructions. A computer program may typically be comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment. However, it should be appreciated that any particular program nomenclature that follows is used merely for convenience, and thus the invention should not be limited to use solely in any specific application identified and/or implied by such nomenclature.

Verification manager 102 provides an interface to other components of the functional verification management system 100 for users, such as engineers, designers, administrators, etc. Using the verification manager 102, the process of functional verification may be managed or monitored, preferences may be set, reports may be generated, and administration tasks performed. Verification manager 102 may, in one embodiment, be in a networked environment so that is accessible by a plurality of users on workstations. Verification manager 102 may also be a Web-based application so that it may easily be accessed by users on different types of workstations. A Web-based application also allows users to have a more consistent "front end" for functional verification tools, which allows for improved efficiency and reduced ongoing training. The verification manager 102 may also be used to manage multiple simulation strategies, such as by starting and stopping each, assigning priorities or resources to them, etc. The operation and function of verification manager 102 is described in more detail in relation to FIG. 2.

The verification manager 102 may be in communication with the functional verification database 104. The functional verification database 104 may serve as a centralized database for any data associated with the functional verification and testing. The functional verification database 104 may be stored on one or more storage devices (which may be geographically distributed), such as servers, hard drives, permanent or temporary storage devices, etc., and may utilize any appropriate database, such as mySQL, DB2, etc. The functional verification database 104 may contain any type of data, such as coverage and regression models, simulation traces, architectural coverage information, microarchitectural coverage information, test results, regression data, project preferences, etc.

A centralized functional verification database 104 may provide a number of advantages. One advantage of a centralized database is the information may be accessed by multiple components of system 100, reducing the total storage required. Any component of system 100 with storage or information needs may optionally access and/or save information using the functional verification database 104. Processing time may also be saved, as test results, in one example, may be easily accessed by multiple components of system 100, reducing the need to recreate tests. In addition, functional verification database 104 ensures that all components of system 100 access the most recent data, rather than out-of-date or unsynchronized data.

The coverage analysis environment 106 may be in communication with the functional verification database 104. The coverage analysis environment 106 may serve to provide an interface between system 100 (including the functional verification database 104) and the simulation and test generation environment 122. The coverage analysis environment accomplishes this by receiving information from the simulation and test generation environment 122 (which may be from simulators, test farms, deterministic testbenches, test generators, etc.), analyzing, converting or transforming the information if necessary, and passing the information along to the functional verification database 104 or other parts of the system 100. In addition, the coverage analysis environment 106 may provide system 100 with tests, test specifications, test simulation attributes, test generation information, test coverage values and rankings, etc.

The coverage analysis environment 106 may also monitor and analyze the progress and functional coverage of the verification of the design. The functional coverage may include both architectural coverage analysis and microarchitectural coverage analysis. Functional coverage analysis (either microarchitectural or architectural) may be implemented via PSL, HDL and C assertions (e.g., checkers, monitors, etc.) defined by verification engineers. These monitors and checkers are activated when certain functional scenarios are simulated in the specified manner and order. Once a monitor is fired (activated) it generates a set of messages that are broadcasted to appropriate control modules (such as the analyzer module 110 or the tabulator module 112) for analysis and tabulation.

The coverage analysis environment 106 allows for integration of a wide variety of test generators, analysis tools and simulators by facilitating a "plug-and-play" architecture and data exchange mechanism. This may be accomplished using the coverage analysis environment 106 to receive simulation test results from the simulation and test generation environment 122 and to convert the simulation test results into a format recognized by the functional verification management system 100. This allows flexibility in the simulation tests performed, as the coverage analysis environment 106 may handle conversion into the appropriate format. If a new simulation or test is added, only a conversion from its format to one of the coverage analysis environment 106 formats may be necessary for that simulation or test to be integrated into the functional verification system 100. This simplifies the integration process and may eliminate the need to change other components of system 100 to accommodate new tests. The conversion could be done by the coverage analysis environment 106, by the simulation and test generation environment 122, or by another converter, or any combination. The ability to handle a wide variety of simulators and tests allows users of the functional verification system 100 to choose the best tool for the job, whether it be internal or external, wherever it is located, whatever format it might have, etc. This may also reduce necessary training, as users need not necessarily be trained on each type of simulation and test, instead only needed to be trained in using the functional verification system 100. New tools and methods may be developed and integrated into system 100 as long as they can read/write to functional verification database 104, communicate with coverage analysis environment 106, and interface with the verification manager 102.

In operation, the coverage analysis environment 106 may monitor tests being run in the simulation and test generation environment 122 to see if any test results impacts the state of verification. If yes, it then may extract the corresponding simulation information and pass it to the various tools and the functional verification database 104. The coverage analysis environment may also keep a log of tests, recording everything it observes or processes, to help protect from loss of information if tests are lost due to server or network malfunctions so that the verification process may be restored based on these logs.

In one embodiment, the coverage analysis environment 106 may manage coverage loads or process queues. In this embodiment, different coverage processes may be running on servers, such as on the server farm 124. The coverage analysis environment 106 may perform a variety of management tasks associated with the processes, such as starting processes, stopping processes, prioritizing processes, distributing processes over multiple servers or other optimization tasks, monitoring, etc. Server farm manager 123 may include a job queue for test generation and simulation and another queue for coverage analysis. Each queue may have a number of servers distributed on the network (or the server farm 124) assigned to them.

The server farm manager 123 may manage start, stop or distribute processes over various servers in the server farm 124, such as to optimize or prioritize processing of different analyses. In one embodiment, parameters or settings of the server farm manager 123 may be set by the coverage analysis environment 106 in response to strategies and priorities defined at the verification manager 102.

The coverage analysis environment 106 may be used to manage the simulation and test generation environment 122. One possible management function is receiving and, if necessary, translating the information from the simulation and test generation environment 122. The coverage analysis environment 106 may also monitor and optionally save or record information received from the simulation and test generation environment 122. Information, such as commands, may also be transmitted to the simulation and test generation environment 122 from the coverage analysis environment 106. This information (such as test start or stop commands) may be optionally transmitted further to one or more test generators 121. User preferences received via the verification manager 102 may also be transmitted to the simulation manager 122. In a further embodiment, the coverage analysis environment 106 may receive an indication of user input (either directly, from the verification manager 102, etc.) and one or more commands based on the user input may be transmitted to the simulation and test generation environment 122. The types of commands available to be transmitted to the simulation manager 122 may depend on the user's level of access; an administrator, for example, may have unlimited access while a typical user may only be able to start and stop tests.

Another function of the coverage analysis environment 106 may be to pass analysis tasks to the coverage server farm 124 for performing. Server farm 124 may include one or more servers or other storage devices. An analysis task may be sent to server farm 124, including processes initiated by the director module 108, the analyzer module 110, the tabulator module 112, the harvester module 114, the trace generator 116, the extractor module 118, etc. A log of these processes and their intermediate data may be stored on server farm 124 storage devices. Final results may be converted, if necessary, and forwarded to the functional verification database 104.

The regression suite 120 may be used to store a set of tests that, in the event of a change in the system design, could be run again to ensure functional verification. Control of the regression suite 120 may be performed internally, by the harvester module 114, the coverage analysis module 106, directly by users using the verification manager 102, or any combination thereof.

The simulation and test generation environment 122 may include any simulators or tests that are used in the functional verification process. Tests may optionally be included in one or more test generators 121, which may include tests manually input by engineers, automatically generated tests, etc. The simulators, test generators and tests may be distributed over multiple servers or computers (which may also be geographically distributed). Simulations (including tests or the results of simulators) may test for failures (also known as bugs or faults) in the design, which are situations where the logic expressed in the design language (eg. VHDL, Verilog) does not perform correctly under specific situations. Sometimes the failure cases are as simple as typographical errors and are found immediately. Other times, the failures require many different logic structures to align with very specific values causing a "window condition". Ensuring that all relevant and approximate scenarios for a "window condition" are exercised may require a large number of tests exercising all classes of scenarios functionally possible in the target "window" under all permissible "condition" combinations. In most cases, managing such a large problem space requires significant computing power.

Testbenches are stimulus/response systems commonly described in Verilog, VHDL, C/C++ or proprietary HVL (Hardware Verification Languages) while the design is described in Verilog or VHDL at the RTL or gate level. The testbenches are developed to stimulate and verify the responses of the design. Depending on how the testbenches are structured, they can implement black box, white box directed, or constrained random testing methodologies. The simulation and test generation environment 122 may include any combination of these types of testing, as well as any other types. System 100 may support management and control of the various verification methodologies, such as those described below.

Black box testing assumes no knowledge of the internals of the design. In black box testing, the testbench applies real-world stimuli to the primary inputs of the design and verifies responses at the primary outputs. Black Box testing is accomplished by executing high-level behavioral models in parallel with the design and comparing the outputs of both, executing protocol generators that apply stimuli and check the responses, or capturing real-world stimuli and responses that testbenches apply to the design. While black box testing enables verification using stimuli that replicate the typical operation of the design, but is flawed in that the actual stimuli may not catch corner cases, coverage is typically low, and the stimulus may repetitively test the same functionality, which wastes verification resources.

White Box Directed testing assumes that some knowledge of the internals of the DUV (Design Under Verification) are known. Testbenches used in White Box Directed testing verifies specific design functionality, including potential corner case problems. The testbenches are written based on knowledge of how the design should work. White Box Directed testing has increased focus on the functionality of the design and corner cases, so simulation resources are not wasted relative to Black Box Testing. White Box Directed testing requires, however, that testbench developers understand possible problems and manually create the testbenches, and more resources are required to generate tests when compared to Black Box testing.

Black Box testing provides real-world scenarios but may result in poor controllability, observability, and coverage. White Box Directed testing provides focused verification of predetermined scenarios, but it is time consuming to create tests—and the tests only address predetermined scenarios. White Box Directed testing may be enhanced by adding randomness to the sequences of stimuli presented to the design, as well as by creating tests that are self-checking, which is commonly referred to as Constrained Random testing.

Constrained Random testing may provide the advantages of both Black Box and White Box Directed testing. It provides randomness as in Black Box testing but with a higher level of test efficiency, and it delivers the controllability and observability of White Box Directed testing (that typically uncovers potential bugs in preconceived corner-case scenarios), thus it may achieve a bug-free design while accelerating functional convergence. The implementation of Constrained Random self-checking testbenches requires a testbench language in which you specify and launch hundreds of tasks concurrently, enabling realistic design activity. The testbench language may support re-entrancy (that is, the ability to invoke the same task concurrently), randomization of tasks, synchronization of concurrent tasks, dynamic processes, tracking multiple tasks, and specification of expected responses.

The director module 108 may analyze functional coverage and provide human language instructions (e.g., English) to users, such as test engineers. The direction to users may include a description of a test to be generated to fill a "hole" in coverage. This may be particularly useful when a test requires creation by a human. Human language requirement directives may be automatically translated to other languages to accommodate verification support teams in different countries or corporate locations. This allows functional verification to be completed efficiently, as holes in coverage are identified and tests are created to address the holes. In one embodiment, knowledge-based methods are used to convert verification shortcomings to description that users can easily understand. The description may include advice on how to define and generate a test, tailored to the engineer's level of experience and familiarity with test language and test generators. This can save time for the engineer, the team leader (who often has to review the engineer's work), and processing resources by producing targeted tests. In a further embodiment, the director module 108 provides test specification in a language readable by the automatic test generator, taking the human test engineer out of the process, saving additional resources and removing error-prone processes. When a test is completed, it may be added to the simulation and test generation environment 122.

The analyzer module 110 and the tabulator module 112 may, separately or collectively, provide collection, analysis, and modeling of coverage data. The tabulator module 112 may collect and provide simple analysis of coverage data (such as tabulation of design states hit) and also provide the results to the analyzer module 110. This analysis may include tabulation of test features, functional coverage, etc. The analyzer module 110 may provide a language and environment to define what tests, models, coverage schemes, etc. in which a user is interested. The analyzer module 110 typically provides more complex analysis than the tabulator module 112 and may be used to define preferences at the signal level, whereas the tabulator module 112 usually deals at the instruction level. The analyzer module 110 may be used to perform sophisticated analysis at the microarchitectural level as well as the architectural level.

The harvester module 114 may be used to define, model, manage, customize, and update the regression suite 120 and regression testing generally. The harvester module 114 may include a modeling language for generating regression tests. The harvester module 114 may communicate directly with the functional verification database 104, the regression suite 120, or the extractor module 118. In one embodiment, the harvester module 114 receives and analyzes a new test result from the simulator environment 122, determines if any new states are hit (e.g., whether any new coverage data was generated), and saves the test result if the simulation provided new and unique results. In another embodiment, the harvester module 114 further optimizes the test results by eliminating earlier test results if they are supplanted by more recent ones. For example, if test C provides all of the information that earlier tests A and B provided, test C can be saved and tests A and B can be eliminated from the regression suite 120, saving storage space and future processing time. The harvester module 114 thus may provide at least some control over the regression suite 120 so that tests can be saved, accessed, and deleted. This functionality may serve to reduce the size of the regression suite 120 and to speed up retesting when changes to the functional design are made necessitating regression testing.

Using the harvester module 114, many aspects of the regression testing may be configured. For example, the size of regression testing, the number of tests, the location of tests, the frequency of archiving, how much duplication is permissible, the uniqueness of the tests, etc., may all be configured. These aspects may be configured utilizing harvesting models, which may be defined by any modeling language. Configuration may occur using the verification manager 102 to control and program the harvester module 114 settings, such as the harvesting models.

The trace generator module 116 may convert simulation traces to an appropriate format for the analyzer module 110. The trace generator module 116 may also convert traces for use by the functional verification database 104. In this embodiment, the trace generator module 116 may convert (or translate, transform, etc.) specific test and simulation dumps and traces to a format usable by the functional verification database 104 or the analyzer module 110. An optional Instruction Set Simulation (ISS) module 126 may also be included to convert a design-specific assembly language test program to files for use by the trace generator module 116.

The extractor module 118 is used to extract information from simulation logs or dumps to determine what kind of monitor was hit or exercised by the test. Monitors are routines that are set up to monitor a specific situation for which more information is desired. The extractor module 118 may be used to also determine, based on communication with the harvester module 114, whether a test makes any new contribution to the existing tests contained within the regression suite 120. In an alternative embodiment, this analysis function is performed instead by the harvester module 114 and the extractor module simply extracts information and determines the relevant monitor. User-defined criteria for regression may be utilized to provide more precise control over the analysis.

All of the management modules may run on servers or other computers. In one embodiment, each module could have its own server, all modules could run on a single server, or some other combination may be used. If a distributed processing model is used, a load leveler may optionally be used to help distribute the processing tasks associated with each management module. An administrator may optionally use the verification manager 102, for example, to help distribute the process to optimal servers. The potential for distributed operation and processing provides additional flexibility for optimization and fault-tolerance.

Any of the management modules of the functional verification management system 100, or any of their functions, may be combined in any way, such as by combining two modules into one or by taking functions from one module to another. For example, the tabulator module 110 and the analyzer module 112 may be combined into one module that performs the roles of both. Data may be transmitted between modules of the functional verification management system 100 via any form or method, including packets, network packets, etc.

Figure 2:
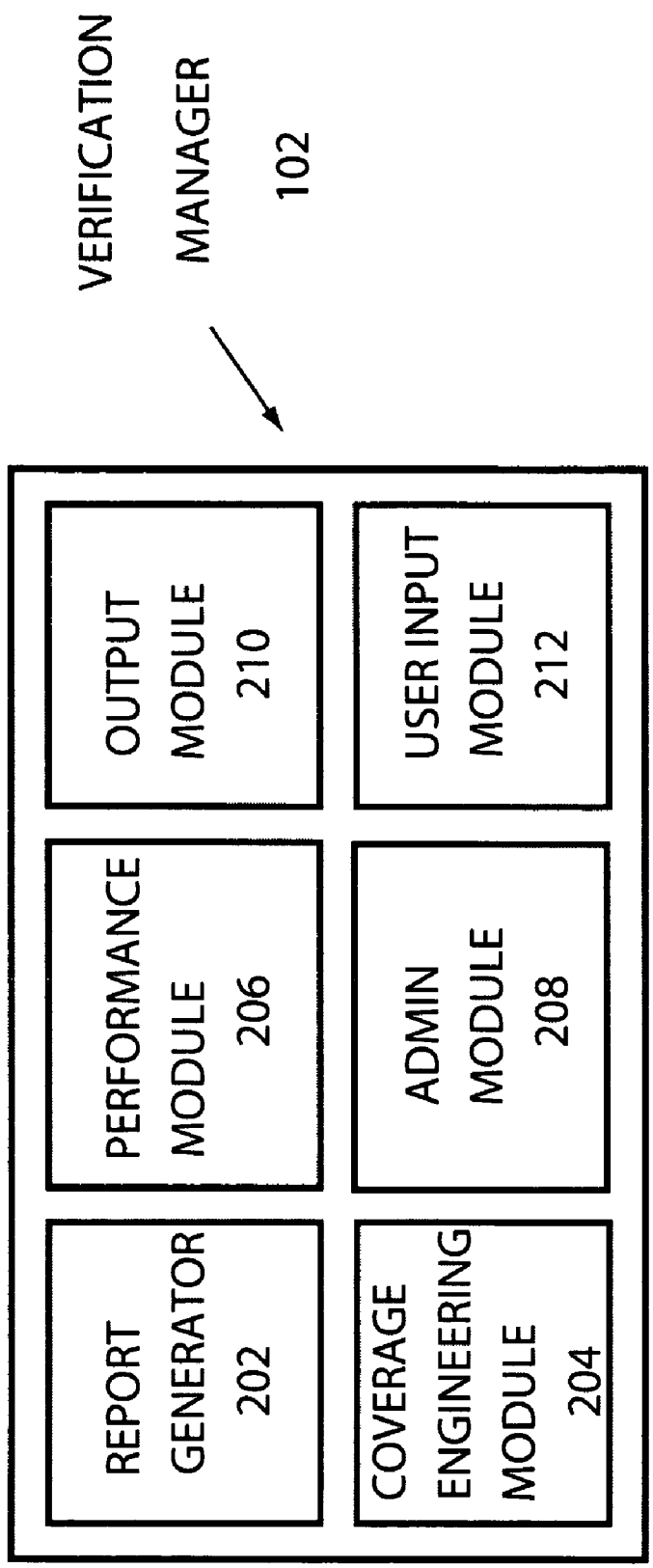
FIG. 2 depicts one embodiment of the verification manager of the functional verification management system of FIG. 1.

Referring now to FIG. 2, there is shown one embodiment of the verification manager 102 of the functional verification management system 100 described in relation to FIG. 1. In the embodiment of FIG. 2, verification manager 102 includes a report generator 202, a coverage engineering module 204, a performance module 206, and an administration module 208. The verification manager may also contain a output module 210 and a user input module 212. Storage of user preferences, etc., may be local at the verification manager 102 or at a different location, such as the functional verification database 104.

The report generator 202 may be used to create reports for users of the verification manager 102. In one embodiment, the report generator 202 may be used to generate coverage reports of varying depth and complexity. The report functionality of the report generator 202 may be, in this embodiment, available to all users of the functional verification management system 100. The reports generated by the report generator 202 may be customized in any way, such as by format, source of data, time frames, type of report, etc. Reports are discussed in more detail in relation to FIG. 5.

The coverage reports generated by the report generator 202 may include reports based on the design sub-unit, unit, or system level. The reports may also include information regarding architectural or microarchitectural coverage. Architectural-level reports may include coverage information about the instruction set, registers, or other high level features. For example, an architectural-level report could include results such as the percentage of instructions executed, whether or not all combinations were executed (including before and after each other), etc. Microarchitectural-level reports may include information at the signal level, such as whether a group of signals changed value in a particular sequence.

Coverage reports may also be either based on continuous data or based on a specific time or condition. In one embodiment, a new report could be generated when coverage is improved by a specified percentage or when a certain level of coverage is reached. In another embodiment, a report could be based on the last 24 hours or since the last significant change in the tested system. Reports generated can be sent via e-mail, stored in functional verification database 104, made available on the Internet or intranet, or any other wired or wireless interface mechanism.

The coverage engineering module 204 may be used to control or customize various settings in the functional verification management system 100. Access to the functionality of the coverage engineering module 204 may, in one embodiment, be restricted to certain types of users, such as coverage engineers and administrators, as changes or control by untrained or unskilled users who may not understand the consequences of requested changes may cause incorrect reporting or loss of data.

In one embodiment, the coverage engineering module 204 may be used to retire particular rules or models. For example, if all features of a model have been observed a predefined number of times, the model could be retired (i.e., deactivated) to save unnecessary processing time and/or storage space. Harvesting models may also be modified, such as by defining conditions as to whether a test should be sent to regression or bypassed. In this embodiment, the standards for sending a test to the regression suite 120 can be raised or lowered depending on the particular testing needs.

In another embodiment, the coverage engineering module 204 may be used to configure monitors. Monitors are routines that are set up in response to a specific situation for which more information is desired. If a particular signal goes high, in one example, a monitor may be set up to observe the next three cycles and record the results. This allows a user such as a coverage engineer to analyze the monitor results to ensure proper operation (e.g., to observe that a problem was corrected). Not only can an engineer define new monitors and checkers and add to the system 100 via the verification manager 102, the engineer may also combine existing monitors to form an event, deactivate monitors, change the criteria for monitors, etc.

The coverage engineering module 204 may also be used to set criteria and/or conditions for tests. Many aspects of tests may be customized, such as frequency of generating and simulating tests, the number of times a test need be generated, the different components of tests, the time and/or place for simulating a test, etc.

The performance module 206 may be used to monitor and/or control performance or configuration aspects of the functional verification management system 100. The performance module 206 may provide real-time displays, reports (such as based on a particular timeframe), warnings or alerts, etc., and may also be used to redirect computer resources (such as processing power, disk space, etc.) when needed or desired. The performance module 206 may accept direction via direct user input, via batch files, via calculated or defined parameters, etc. In one embodiment, disk space is controlled, such as by defining disk partitions for particular tests, models, etc. Different disk partitions may be set up for different simulation strategies so that each can be easily managed independently. Disk space may also be monitored so that tasks and data routines could be reconfigured when, say, a disk becomes almost full so as to prevent decreases in performance. The performance module 206 may also monitor and/or control throughput on the network so that bottlenecks or chokepoints can be identified and cured.

The performance module 206, in one embodiment, may also monitor and/or control databases and servers. If a database has become full, the performance module 206 could report that state, and a new database may be brought on-line to help via user command or automatically. Server usage and capacity may also be monitored and/or controlled. If one server went down, in one example, a new server could be brought on-line or the tasks assigned to the failed server could be redirected. This function may be particularly useful when multiple simulation strategies are active and resources need to be efficiently distributed.

The performance module 206 may also be used to assist with regression management. While the harvester module 114 may be used to manage particular aspects of the regression suite 120 (such as how many tests are saved, the rigorousness of the regression modeling, etc.), the performance module 206 may be used to receive user input or preferences for management of the regression suite 120. One example of a user preference would be the strictness of the regression testing (i.e., how rigorous it must be). Other examples could be frequency of regression testing, event triggers to start regression testing (such as size of change, period of time, etc.), etc. Commands to the regression suite 120 may also be received and processed by the performance module 206, such as when a user wants to start or stop regression testing, wants to delete a particular test, various regressions to be compiled for a project, etc.

The administration module 208 may be used to access administrative data and to perform administrative tasks. Permissions to different aspects of the functional verification management system 100 may be restricted to those users with the appropriate needs and training. In one embodiment, access to the administration module 208 would be limited to personnel with the appropriate training and authority. In this embodiment, a user with administrator access may add/delete users, passwords, file system, projects, etc. In a further embodiment, other users besides those with administrative access could define and add projects to the system 100 but could not delete a project directly. In this embodiment, requests to archive or delete a project are sent to an administrator.

The output module 210 includes means to convey information to a user, such as a computer monitor, monitor, audible device, communication device such as e-mail, etc. The user input module 212 may be used to receive and/or process user input, such as input received by keyboard entries, verbal commands, e-mail communications, wired or wireless mechanisms, etc.

Figure 3:
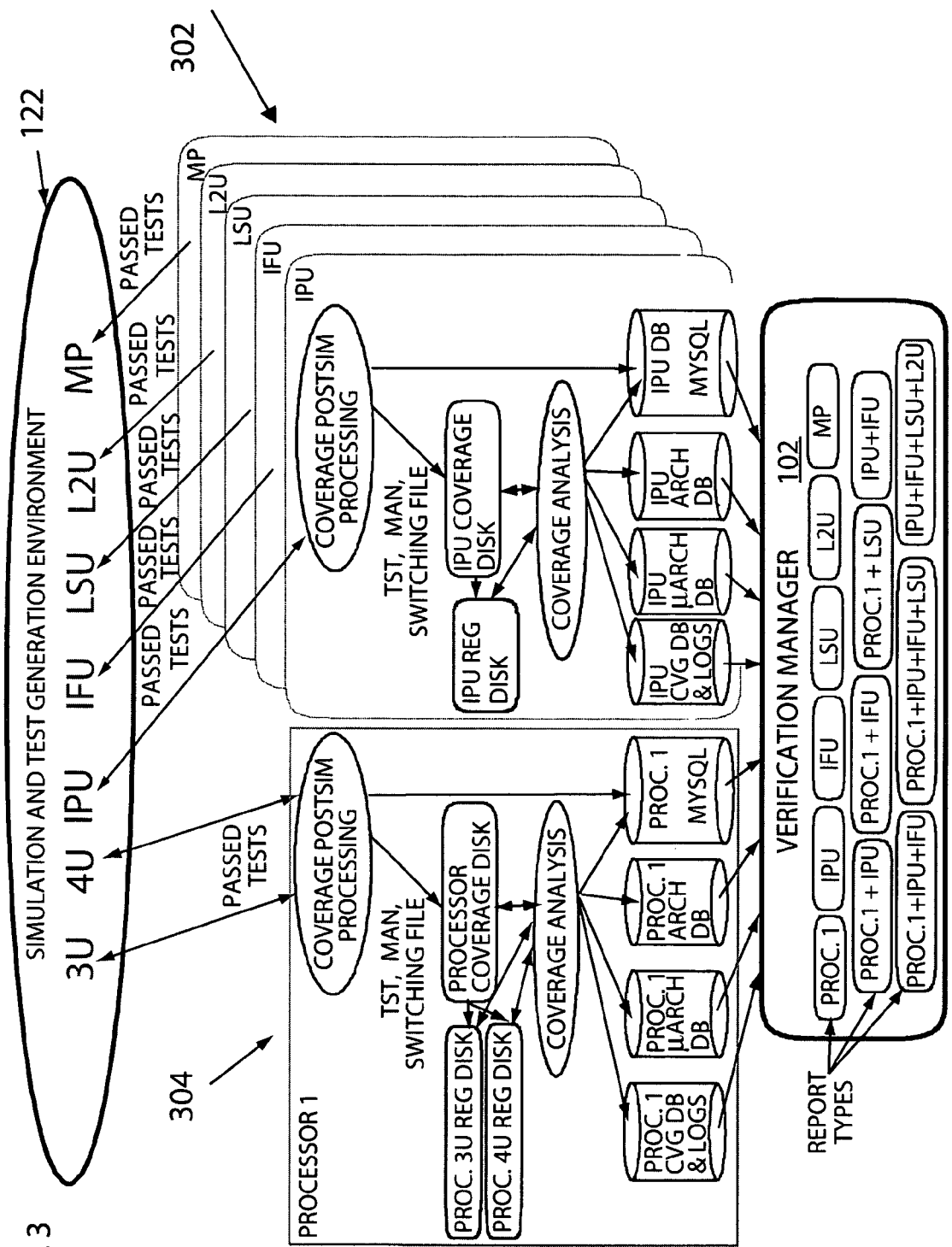
FIG. 3 depicts one embodiment of the functional verification management system supporting multiple simulation environments.

The functional verification management system 100 may include multiple simulation strategies, as depicted in FIG. 3. System 300 includes a plurality of simulation strategies 302 (such as MP, L2U, LSU, etc.). Many IC design shops, for example, utilize multiple simulation strategies, where different chips, units, sub-units and functions may be under design and verification simultaneously. This allows for hierarchical simulation capability consistent with the design process. Different type of coverage analysis tools may be used, depending on which is most appropriate for the level of testing and for the item being verified. As described in more detail below, the functional verification management system 300 may be used to manage multiple simulation strategies within its basic architecture. System 300 may therefore be utilized to support multiple verification methodologies for a design. Each methodology may be applied to a design unit or design partition developed by a different team in a different location. Although each individual methodology may be maintained and supported at its own remote location, all of the methodologies may be monitored, managed, and controlled from a central location.

Tests that have successfully passed the simulation and their corresponding simulation traces and logs may be accessed by the simulation and test generation environment 122, the verification manager 102, the functional verification database 104, or the coverage analysis environment 106. Accordingly, system 300 may accommodate multiple simulation environments (or strategies) at multiple points in the design hierarchy, such as the system level (processor, multiprocessor (MP), multi-unit level (3 Unit—3U, 4 Unit—4U), unit level (Instruction Processing Unit—IPU, Instruction Fetch Unit—IFU, Load Storage Unit—LSU, Level 2 Catch—L2U), design sub-units, etc. Each environment may have its own coverage disk partition, regression disk partition, architectural and microarchitectural coverage database, data gathering and analysis via the verification manager 102, regression strategy controls and defaults, etc. All aspects of system 100 described herein may apply to any environment or strategy of system 300. In this embodiment, each strategy (e.g., 3U, IPU, etc.) is a copy or instance of system 100 customized for the unit or core.

Unit level instances 302 (e.g., IPU, IFU, etc.) of the functional verification management system may be instances or copies of the functional verification management system 100 customized for those units. System level instances 304 of the functional verification management system may be instances or copies of the functional verification management system 100 customized for the overall system (e.g., the processor being tested, Processor 1). Each of the instances 302, 304 may utilize a different strategy.

The individual verification strategies may also be given different priorities for different resources (such as disk space or processing time), strategies may be started or stopped, each strategy may have its own back-end and front-end priority, and may be set up for one or more coverage analysis tasks, etc. This allows each design team to utilize the most efficient design and verification tools and simulation strategies for their segment of the design. The overall project lead, in one embodiment, can manage and monitor the entire design from the verification manager 102, based on a central verification database 104 and the coverage analysis environment 106. Using the verification manager 102, users may also view, analyze or subscribe to coverage reports for the entire system (Processor1), any of its units (IPU, IFU, etc.) or combined units (3U, 4U). Combined unit reports may include a 3U report (IPU+IFU+LSU), a 4U report (IPU+IFU+LSU+L2U), a Multi-processor system (MP), etc.

Figure 4:
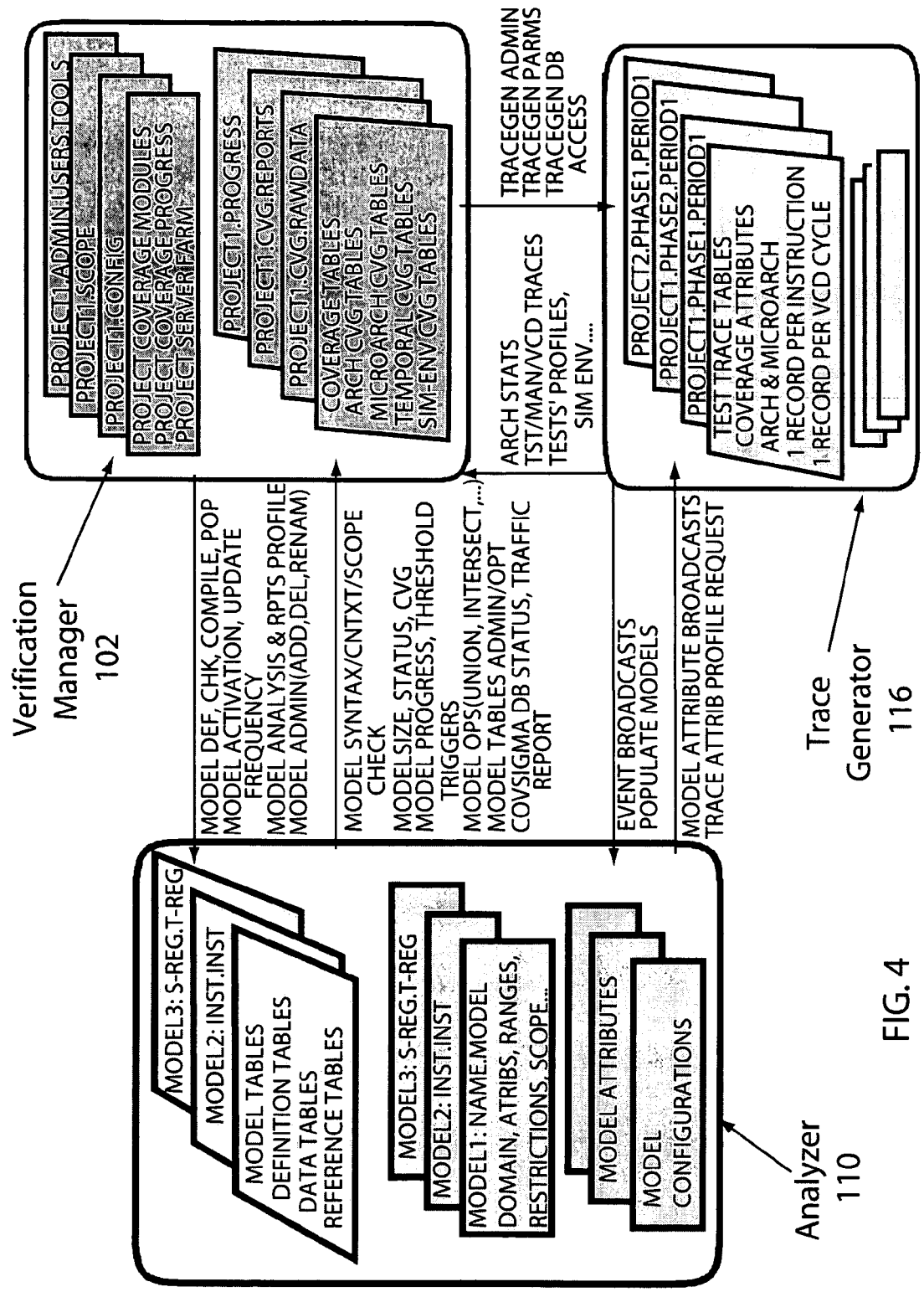
FIG. 4 depicts a data model according to one embodiment of the functional verification management system.

FIG. 4 depicts a partial data model according to one embodiment of the functional verification management system 100. The data model of FIG. 4 may be a dynamic data model, where the instance of a piece of data in one database is dynamically updated and synchronized with other databases. In the depicted embodiment of FIG. 4, information may be transmitted by and between the verification manager 102, the analyzer module 110, and the trace generator 116. Inflow of data from tests simulated is propagated to coverage modeling agents for analysis and dissemination across the analyzer module 110 processes and their corresponding database tables. Generated data also flows to the verification manager 102 for further analysis and report generation. The partial data model of FIG. 4 is an example of the modular dynamic data model deployed in system 100.

In one embodiment, system 100 and the data model include mechanisms for consistency checking and data integrity in order to preserve the accuracy of the data. In another embodiment, data transmitted within system 100 includes an indication of source and temporal attributes or other identifying information. It is desirable, for example, in the functional verification of complex systems such as IC chips to be able to identify the originating source of a test or set of tests that made a unique contribution to the coverage space (e.g., a new verified design state space). Other information may also be associated with test data, such as a cross-reference of its contribution to the active models or advisory reports or warnings.

Figure 5:
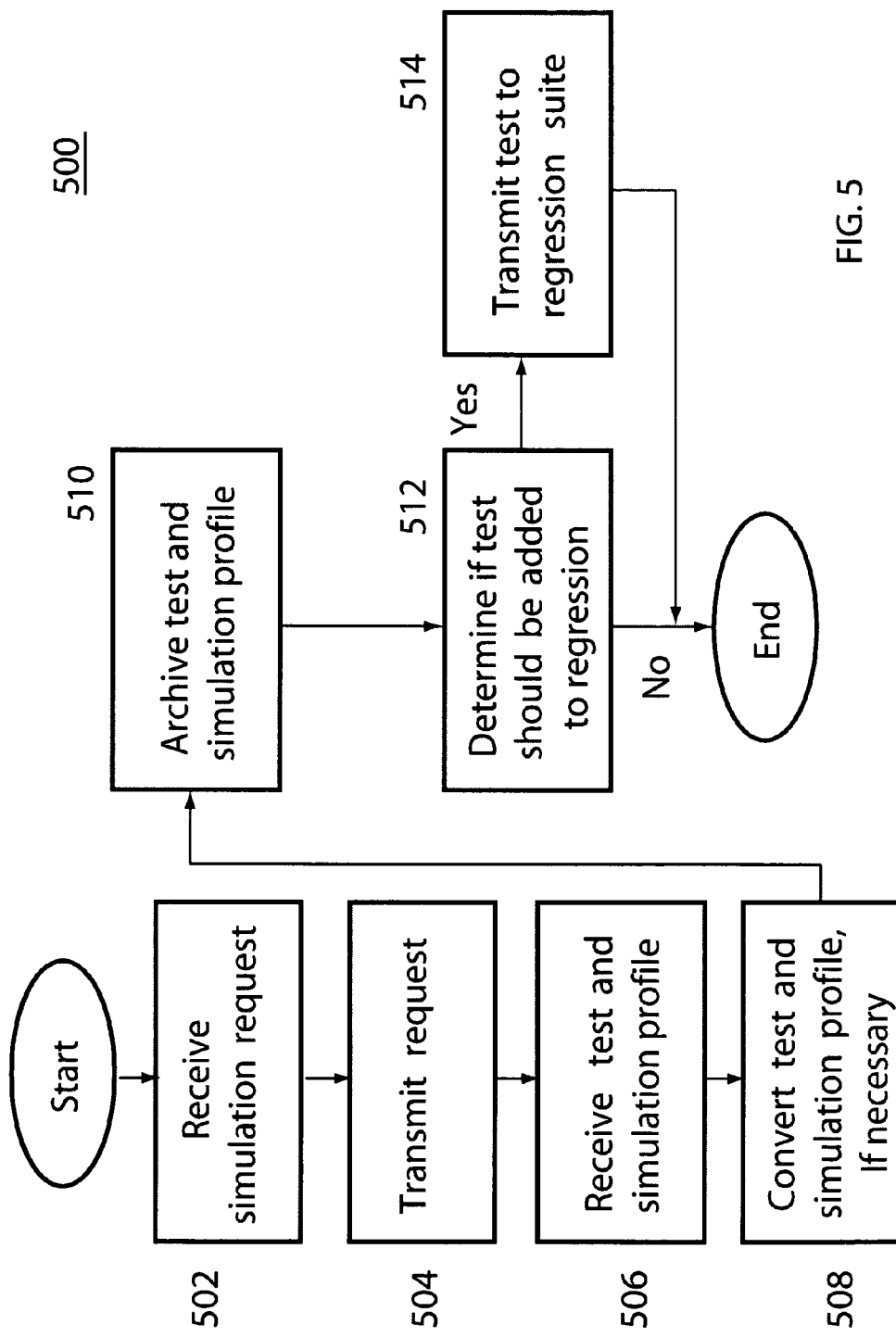
FIG. 5 depicts an example of a flow chart for a method for requesting a test and processing the test results.

FIG. 5 depicts an example of a flow chart 500 for a method for requesting a test and processing the test results. The method of flow chart 500 may be performed by the coverage analysis environment 106 in one embodiment. The method begins with step 502 by receiving a simulation request, a design attribute or a function to be tested. The simulation request may be received from any component of the functional verification management system 100. The method continues to step 504 by transmitting a request for a test to be performed, where the test requested is based on the simulation request. In one embodiment, the test request may be transmitted to a simulation and test generation environment 122, which manages test generation and simulation. In step 506, the test and simulation profile are received, such as from the simulation and test generation environment 122.

In optional step 508, the test simulation results and the test itself are converted, if necessary. The conversion ability allows many different formats of simulations or tests to be used while still allowing consistency in the use of formats throughout system 100. For example, test results in a wide variety of formats may all be converted to one standard format that may be easily accessed by other components of system 100, such as the analyzer module 110, the verification manager 102, etc. This eliminates the need to customize these different modules for each new test format, minimizing impact to the system, reducing training and programming time, and allowing users to seek out the most appropriate tests and tools, regardless of format. The information used for the conversion of step 508 may be located anywhere, such as in the coverage analysis environment 106, the functional verification database 104, the simulation manager 122, the data packet containing the test results, etc.

The method continues in optional step 510, where the test and its simulation profile are saved. In one embodiment, test results are saved or archived on the functional verification database 104 so that the test need not be simulated again. In this embodiment, information about the test (such as time, format, how generated, simulation conditions, etc.) may also be archived with the test and its simulation profile. The method continues in optional step 512, analyzing the test and simulation profile. Analysis may be performed by the tabulator module 110, the analyzer module 112, or any other component of the functional verification management system 100. Analysis may include an assessment of whether the test makes any new contribution to the progress of verification or if it could enhance the current environment by replacing multiple tests in the regression suite 120, etc.

The method continues in step 514 where it is determined if the test should be saved as part of the regression suite 120. This step may be performed by the coverage analysis environment 106, the harvester module 114, or other component. A test may be saved, for example, when it contributes to the functional coverage (i.e., contributes new information). If a decision is made to save the test, the test and its profile are transmitted to the regression suite 120 in step 516, after which the method terminates. If the test is not to be saved in the regression suite 120, the method simply terminates.

Figure 6:
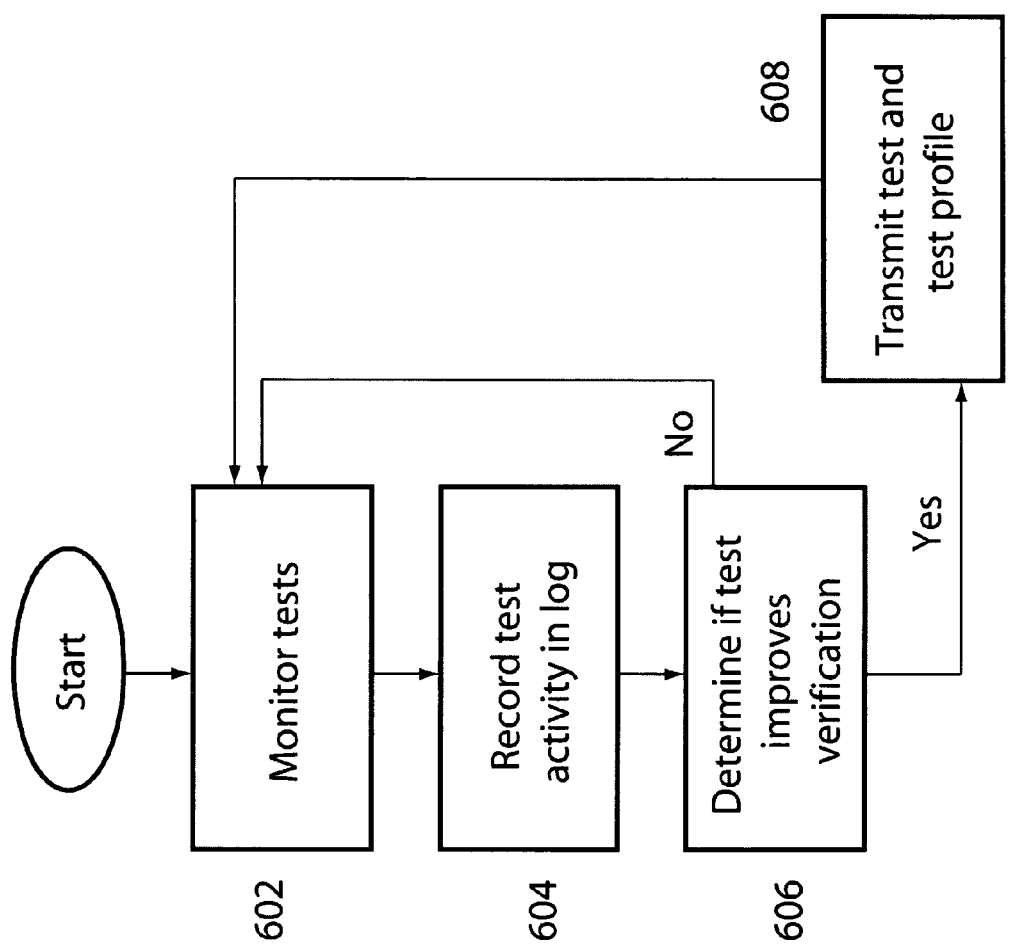
FIG. 6 depicts an example of a flow chart for a method of monitoring tests and updating the regression suite.

FIG. 6 depicts an example of a flow chart for a method of monitoring tests and updating the regression suite. Method 600 of FIG. 6 may be run on the harvester module 114, but may also be run on other components, such as the coverage analysis environment 106. The method begins in step 602, where tests being simulated are monitored. In one embodiment, the simulation and test generation environment 122 may be monitored, as information about tests being run may be available there. In another embodiment, test results (i.e., tests associated with simulation traces of logs) may be found on the functional verification database 104. The method continues in optional step 604, recording test activity in a log. This step provides backup capability in the event that test results stored in other locations are lost.

In step 606, the method determines if a test impacts the functional verification, such as by providing additional functional coverage. In the event the test adds coverage, the function continues to step 608, where the test and test profile are transmitted to the regression suite 120 for saving for future regression testing. If the test does not add coverage (or after a valuable test is transmitted), the method continues back to step 602 for continued monitoring.

FIG. 7 depicts one embodiment of tables generated by the report generator 202 of FIG. 2. Table 702 is a microarchitectural coverage table that includes a summary of microarchitectural events defined for a project. For each event, the number of monitors developed for it is listed, as well as the actual number of hits, the goal number of hits, and the percent coverage. The goal number of hits indicates the number of unique hits desired for a monitor (e.g., how many different tests need to activate the monitor for it to be considered fully covered). Actual number of hits indicates the number of unique hits measured or observed thus far for a monitor. Using table 702, a user could ascertain that Coverage Event "SubmitNoInstructions" is 75% verified and that Coverage Event "Diss0FaPipe" is fully verified. In one alternative embodiment shown in table 704, information about the monitors for each event may be accessed (such as by clicking on the event name), including actual and goal number of hits and percent coverage. This would allow the user to see the actual coverage for individual monitors. As seen in table 704, the individual monitors comprising Coverage Event "SubmitNoInstructions" have varying levels of coverage (resulting in the total of 75%). The user could then request, in this example, new tests that would target design features associated with low coverage monitors. Charts, tables, reports, etc. created by report generator 202 may be in any format and via any media, such as print-outs, viewed on a computer screen, audibly communicated, via e-mail, etc.

Any type of report may be generated by the report generator 202. Reports may be automatically generated, generated upon the occurrence of a particular event (a specific date, a specific number of tests simulated, functional coverage threshold, etc.), generated upon user request, etc. The format, content, frequency, comprehensiveness, etc., of reports may be modified by a user in one embodiment.

Microarchitectural reports may include coverage summaries, coverage hole reports, harvested tests, test regression reports, progress reports, as well as specific test type reports. Coverage summaries may include progress statistics, functional verification summaries, and may be produced upon request or at a certain time, daily, weekly, etc. Coverage hole reports may be supplemented by coverage directives and descriptions of how progress may be made towards them. Harvest test reports may include information about which tests have hit monitors, so that unsuccessful tests may be reconfigured or retired. Test regression reports may generate a list of monitors that have contributed to coverage.

Architectural reports may include coverage summaries, monitor hit/no-hit reports, harvest tests, monitor regression reports, as well as reports associated with a specific test generator. Coverage summaries may include progress statistics, functional verification summaries, and could be produced upon request or at a certain time, daily, weekly, etc. Monitor hit/no-hit reports such as tables 702, 704 may include coverage summaries, lists of all monitors, lists of monitors that were hit or not hit, etc. Harvest test reports may include information about which tests have added coverage. Test regression reports may generate a list of tests that have contributed to coverage.

A verification engineer may use the reports generated and the results of the analyzer and tabulator modules 110, 112, as well as directives generated by the director module 108, to fine tune the verification process for improved utilization of resources (test generators, simulators, verification engineers, coverage engineers, servers, etc.) and faster convergence of verification (higher coverage) by focusing the verification effort to verify remaining unverified design features. Based on the progress reports generated, less efficient test generators 121 could be identified. Optimized regressions could result in faster verification of design at major milestones or after design changes. A verification engineer could also define a verification strategy for continuous and automatic monitoring, analysis and processing of verification tasks.

While the foregoing is directed to embodiments of the present invention, other and further embodiments of the invention may be devised without departing from the basic scope thereof, and the scope thereof is determined by the claims that follow.

What is claimed is:

1. A functional verification management system comprising:
   a verification manager responsive to user input;
   a functional verification database coupled to the verification manager;
   a coverage analysis environment coupled to the functional verification database, wherein the coverage analysis environment is adapted to receive test information from a simulation and test generation environment, wherein further the coverage analysis environment selectively converts test information to a standard format; and wherein further the coverage analysis environment selectively stores in the functional verification database information based on the received test information; and
   an analyzer module coupled to the verification manager and the functional verification database, the analyzer module being adapted to analyze coverage data at both an architectural level and a microarchitectural level.

2. The functional verification management system of claim 1, further comprising:
   a regression suite adapted to store regression tests; and
   a harvester module coupled to the functional verification database and the regression suite, the harvester module being adapted to determine whether a test should be further evaluated for regression testing and to selectively save test information to the regression suite, wherein the harvester module utilizes a harvesting language.

3. The functional verification management system of claim 2, further comprising an extractor module coupled to the harvester module and the functional verification database, the extractor module being adapted to receive simulation logs and extract information from the simulation logs for transmittal to the harvester module.

4. The functional verification management system of claim 1, further comprising a director module coupled to the verification manager and the functional verification database, the director module being adapted to provide an indication of a gap in the functional coverage.

5. The functional verification management system of claim 4, wherein the indication of a gap in the functional coverage includes a natural language instruction on what class of tests are needed to be generated and directions on how to generate them.

6. The functional verification management system of claim 1, further comprising a tabulator module coupled to the verification manager and the functional verification database, the tabulator module being adapted to receive test information, to calculate its contribution to verification tasks, and to generate cumulative test results based on the received test information.

7. The functional verification management system of claim 1, wherein the analyzer module provides a coverage analysis modeling language.

8. The functional verification management system of claim 1, further comprising a trace generator module coupled to the analyzer module and the functional verification database, the trace generator module being adapted to receive tests, wherein the trace generator module converts tests to a format usable by other tools or utilities of the functional verification management system.

9. The functional verification management system of claim 1, wherein the verification manager further comprises a report generator, the report generator being adapted to create reports based on information contained within the functional verification database or information generated by tools or utilities of the functional verification management system.

10. The functional verification management system of claim 1, wherein the verification manager further comprises a coverage engineering module, the coverage engineering module being adapted to configure functional verification settings based on user input.

11. The functional verification management system of claim 1, wherein the verification manager further comprises a performance module, the performance module being adapted to redirect computer resources.

12. The functional verification management system of claim 1, wherein the verification manager further comprises an administration module to perform administration tasks based on user input.

13. The functional verification management system of claim 1, wherein the verification manager is a Web-based application accessible by a plurality of users.

14. The functional verification management system of claim 1, wherein the verification manager and the coverage analysis environment are distributed on at least two servers.

15. The functional verification management system of claim 1, further comprising a server farm manager coupled to the coverage analysis environment, the server farm manager being in communication with a plurality of distributed servers, wherein the server farm manager is adapted to assign a server to any process of the functional verification management system based on the distribution of loads across the plurality of distributed servers.

16. A method for performing functional verification of a system, the method comprising:
receiving a request for a test;
receiving from a simulation and test generation environment an indication of the results of the test;
determining, based on the indication of the results of test, whether the test adds functional coverage;
converting the indication of the test results to a standard format;
saving the indication of the results of the test in the functional verification database;
analyzing coverage data at both an architectural level and a microarchitectural level; and
archiving tests that add functional coverage in a regression suite.

17. A method for performing functional verification of a design, the method comprising:
monitoring tests received from a simulation and test generation environment;
converting the indication of the test results to a standard format;
saving the indication of the results of the test in a functional verification database;
analyzing coverage data at both an architectural level and a microarchitectural level;
determining for each test whether the test adds functional coverage; and
transmitting the test to a regression suite.

18. A computer readable medium containing a program which, when executed, performs an operation, comprising:
monitoring tests received from a simulation and test generation environment;
converting the indication of the test results to a standard format;
saving the indication of the results of the test in a functional verification database;
analyzing coverage data at both an architectural level and a microarchitectural level;
determining for each test whether the test adds functional coverage; and
transmitting the test to a regression suite.

19. A functional verification management system comprising:
a verification manager responsive to user input;
a functional verification database coupled to the verification manager;
a coverage analysis environment coupled to the functional verification database, wherein the coverage analysis environment is adapted to receive test information from a simulation and test generation environment, wherein further the coverage analysis environment selectively converts test information to a standard format; and wherein further the coverage analysis environment selectively stores in the functional verification database information based on the received test information; and
a director module coupled to the verification manager and the functional verification database, the director module being adapted to provide an indication of a gap in the functional coverage, wherein the indication of a gap in the functional coverage includes a natural language instruction on what class of tests are needed to be generated and directions on how to generate them.

* * * * *